(12) United States Patent
Eilert et al.

(10) Patent No.: US 7,106,636 B2
(45) Date of Patent: Sep. 12, 2006

(54) PARTITIONABLE MEMORY DEVICE, SYSTEM, AND METHOD

(75) Inventors: Sean S. Eilert, Penryn, CA (US); John C. Rudelic, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 214 days.

(21) Appl. No.: 10/873,907

(22) Filed: Jun. 22, 2004

(65) Prior Publication Data

US 2005/0281095 A1 Dec. 22, 2005

(51) Int. Cl.
*G11C 7/00* (2006.01)
*G11C 8/00* (2006.01)

(52) U.S. Cl. ............... 365/189.12; 365/189.05; 365/222; 365/230.03; 365/230.06

(58) Field of Classification Search .......... 365/189.12, 365/230.03, 222, 230.06, 189.05; 265/189.05
See application file for complete search history.

(56) References Cited

U.S. PATENT DOCUMENTS

| 5,040,153 | A | * | 8/1991 | Fung et al. ............ 365/230.03 |
| 5,239,505 | A | | 8/1993 | Fazio et al. |
| 6,219,300 | B1 | * | 4/2001 | Tamaki ................... 365/233 |
| 6,757,194 | B1 | * | 6/2004 | Miwa et al. .......... 365/185.03 |
| 2004/0105533 | A1 | * | 6/2004 | Iseli ...................... 379/106.01 |
| 2004/0196723 | A1 | | 10/2004 | Eilert et al. |

* cited by examiner

*Primary Examiner*—Son T. Dinh
(74) *Attorney, Agent, or Firm*—LeMoine Patent

(57) ABSTRACT

A nonvolatile memory device may include circuitry to support the partitioning of the memory into two or more logical partitions. The two or more logical partitions may be accessible by two or more separate interfaces with different characteristics.

21 Claims, 5 Drawing Sheets

PARTITIONABLE MEMORY DEVICE, SYSTEM, AND METHOD

FIELD

The present invention relates generally to memory circuits, and more specifically to nonvolatile memory circuits.

BACKGROUND

Nonvolatile memory devices are memories that retain their state when powered off. Nonvolatile memory devices may be used to store many different types of data in electronic systems. For example, program code to be executed by a processor may be stored in nonvolatile memories. Also for example, media files such as pictures and music may also be stored in nonvolatile memories.

DESCRIPTION OF EMBODIMENTS

Figure 1:
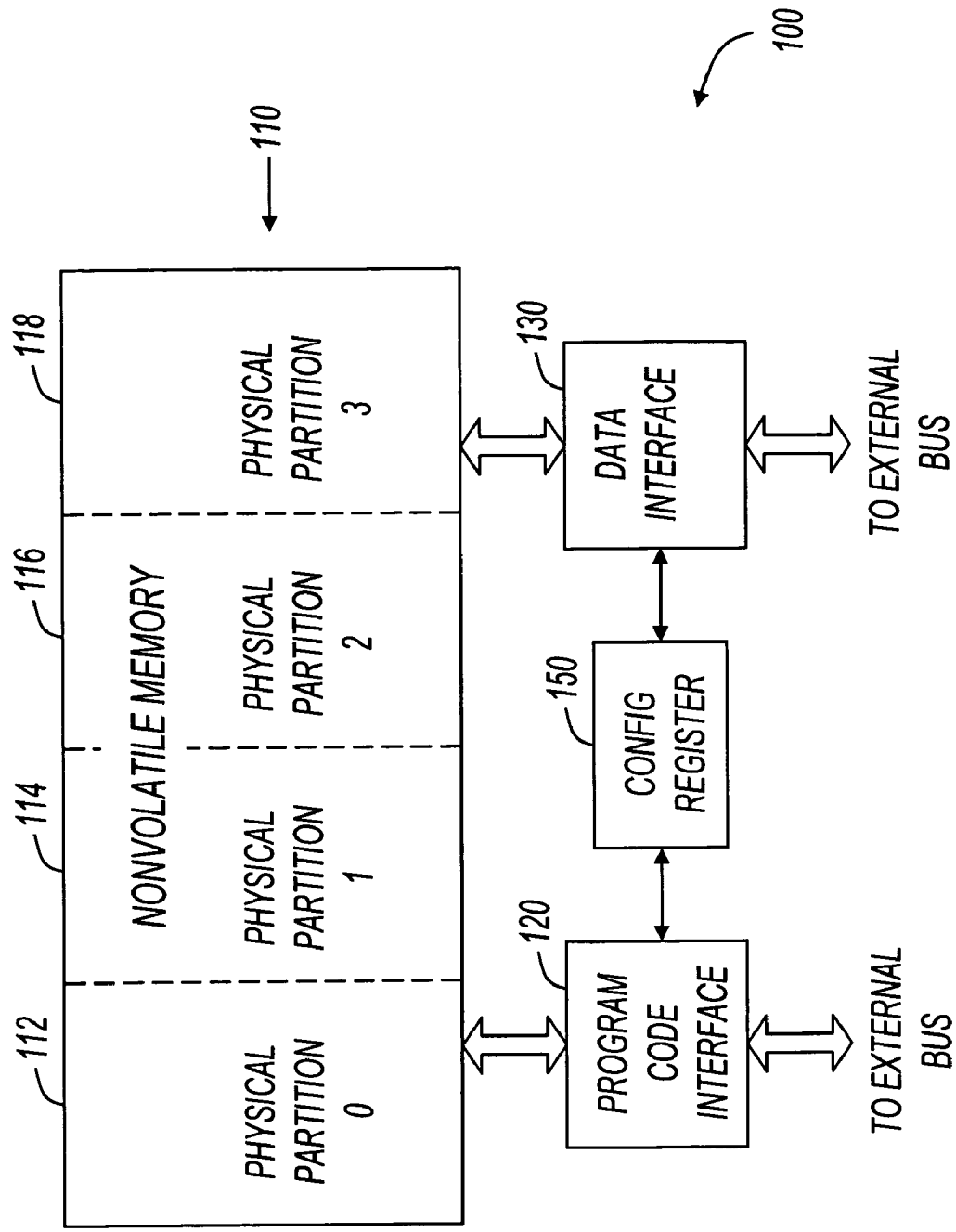
FIGS. 1 and 2 show nonvolatile memory devices.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

FIG. 1 shows a memory device in accordance with various embodiments of the present invention. Memory device 100 includes nonvolatile memory 110, program code interface 120, data interface 130, and configuration register 150. Nonvolatile memory 110 may be any type of memory that maintains its state when power is removed. For example, in some embodiments, nonvolatile memory 110 includes floating gate memory cells, such as flash memory cells.

Nonvolatile memory 110 includes multiple physical partitions. As shown in FIG. 1, nonvolatile memory 110 includes physical partitions 0, 1, 2, and 3, shown at 112, 114, 116, and 118, respectively. For ease of illustration, nonvolatile memory 110 is shown with four physical partitions. In some embodiments, many more than four physical partitions are included within nonvolatile memory 110. A physical partition within nonvolatile memory 110 may be any separately addressable section within the memory device. For example, a physical partition may include an array of memory cells, a block of memory cells, a number of rows of memory cells, a number of columns of memory cells, or any combination thereof. For example, in some embodiments, a physical partition may be a separate physical array within the nonvolatile memory. Also for example, a physical partition may be a separately addressable portion of one contiguous array.

In various embodiments of the present invention, physical partitions within nonvolatile memory 110 may be grouped to form two or more logical partitions. For example, physical partitions 112 and 114 may be combined into one logical partition, and physical partitions 116 and 118 may be combined to form a second logical partition. In general, any number of physical partitions may be grouped to form a logical partition.

In embodiments represented by FIG. 1, program code interface 120 accesses the first logical partition within nonvolatile memory 110 and data interface 130 accesses the second logical partition within nonvolatile memory 110. Both program code interface 120 and data interface 130 access configuration register 150, which includes information specifying the grouping of physical partitions into logical partitions. For example, configuration register 150 may be programmed to specify that a first logical partition includes only physical partition 112 and that a second logical partition includes physical partitions 114, 116, and 118. In this example, when program code interface 120 accesses nonvolatile memory 110, it accesses the first logical partition, which is limited to physical partition 112; and when data interface 130 accesses nonvolatile memory 110, it accesses the second logical partition which includes physical partitions 114, 116, and 118.

In some embodiments, configuration register 150 may be programmed through either program code interface 120 or data interface 130. In other embodiments, configuration register 150 is accessible only through one of program code interface 120 and data interface 130. In still further embodiments, configuration register 150 may be programmed using a dedicated interface (not shown) such as a serial interface or a test interface.

Nonvolatile memory 110 may be used to store numerous different types of code and data. These different code and data types may have varied characteristics that are affected by the operation of nonvolatile memory 110. For example, program code may be infrequently updated and frequently read, may be able to tolerate slow in-system write performance, and may require fast deterministic read performance. Also for example, data within nonvolatile memory 110 may be frequently updated and infrequently read, may benefit from high in-system write performance, and may tolerate slower and/or non-deterministic initial access times.

In some embodiments, program code interface 120 and data interface 130 have different operating characteristics to support memory writes and reads of various types of program code and data. For example, program code interface 120 may provide deterministic low latency read cycles, whereas data interface 130 may provide longer latency, higher bandwidth read cycles. Further, because program code may be expected to have longer longevity in nonvolatile memory 110, program code interface 120 may provide slower write performance than data interface 130. In general, program code interface 120 and data interface 130 may operate according to different specifications, and may include circuitry to support differences in any type of operating characteristic.

In some embodiments, program code interface 120 and data interface 130 utilize different types of error correction. For example, program code interface 120 may utilize a Hamming scheme whereas data interface 130 may utilize a Reed-Solomon scheme. In general, a Hamming scheme is faster but less effective error correction, and a Reed-Solomon scheme may be slower but more effective. The various embodiments of the present invention may utilize error correction schemes other than Hamming and Reed-Solomon, as the invention is not limited in this respect.

In some embodiments, configuration register 150 may be programmed by either program code interface 120 or data interface 130. In some embodiments, configuration register 150 is a one-time writeable register that may be written by either the manufacturer of memory device 100 or a systems integrator that includes memory device 100 in an electronic system. For example, a cellular phone manufacturer may include memory device 100 in a cellular phone, and configuration register 150 may be programmed by the cellular telephone manufacturer. In other embodiments, configuration register 150 may be mask-programmable by the manufacturer of memory device 100. In these embodiments, the logical partitions within nonvolatile memory 110 are set during the manufacture of memory device 100. In still further embodiments, configuration register 150 is a read/write register that may be written to at any time during the life of memory device 100. In these embodiments, the physical partitions within nonvolatile memory 110 may be grouped into different logical partitions at any time during the life of memory device 100.

In some embodiments, program code interface 120 and data interface 130 are logical interfaces. For example, one physical interface may exist that is logically divided into two functional units. In other embodiments program code interface 120 and data interface 130 are two physically separate interfaces.

Figure 2:
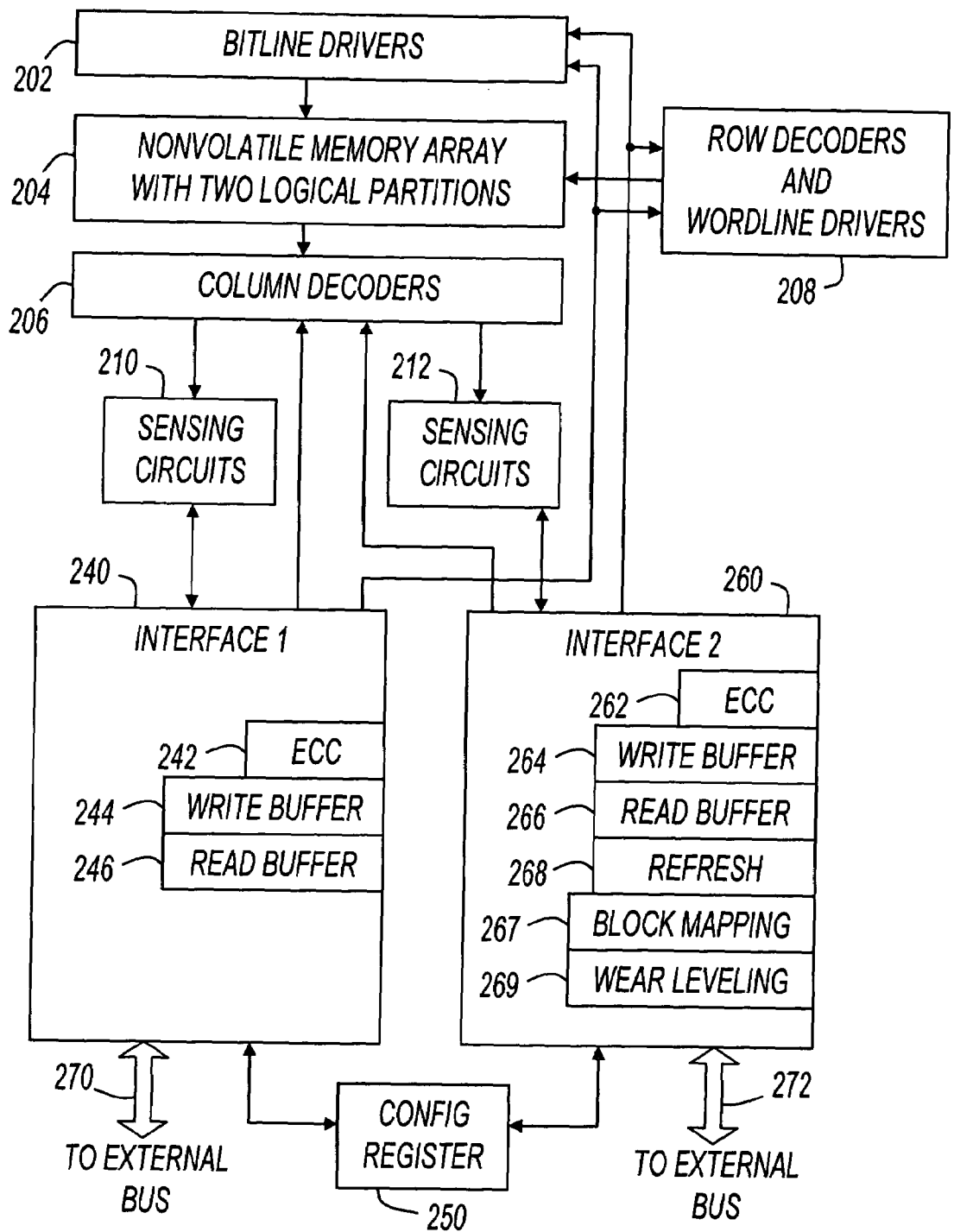

FIG. 2 shows a memory device in accordance with various embodiments of the present invention. Memory device 200 includes nonvolatile memory with two logical partitions 204, bit line drivers 202, column decoders 206, row decoders and wordline drivers 208, sensing circuits 210 and 212, interfaces 240 and 260, and configuration register 250. Nonvolatile memory 204 is a nonvolatile memory with multiple physical partitions, such as nonvolatile memory 110 (FIG. 1). Nonvolatile memory 204 may include any number of physical partitions that are grouped to form two logical partitions. As described above with reference to FIG. 1, the two logical partitions within nonvolatile memory 204 are defined in part by the contents of configuration register 250 and the operation of interfaces 240 and 260.

As shown in FIG. 2, interfaces 240 and 260 influence the operation of bitline drivers 202, column decoders 206, row decoders and wordline drivers 208, and sensing circuits 210 and 212. Interface 240 is shown with error coding and correction (ECC) block 242, write buffer 244, and read buffer 246. Interface 260 is shown with ECC block 262, write buffer 264, read buffer 266, refresh circuitry 268, block mapping circuit 267, and wear leveling circuit 269.

In some embodiments, ECC 242 and ECC 262 provide different types or different amounts of error coding and correction for interface 240 and interface 260. For example, ECC 262 may use fewer bits for error coding than ECC 242. In further embodiments, one of ECC 242 and 262 may utilize only hardware while the other may utilize a combination of hardware and software. For example, interface 240 may be used for program code and ECC 242 may be a hardware implementation that is fast and has a deterministic latency. Further, interface 260 may be used for multimedia data files and ECC 262 may include hardware and software and may not have a deterministic latency.

Write buffers 244 and 264 may be of different sizes, and read buffers 246 and 266 may be of different sizes. By incorporating buffers of different sizes in interfaces 240 and 260, memory device 200 may provide different operating characteristics based on different expected usage patterns of the two logical partitions within nonvolatile memory 204. Also as shown in FIG. 2, interface 260 includes refresh circuitry 268 to refresh the contents of the logical partition within nonvolatile memory 204 that is accessible by interface 260. In some embodiments, both interface 240 and interface 260 include refresh circuitry.

Block mapping circuit 267 is a circuit that may map blocks within memory 204 provide abstraction of physical blocks to logical blocks. By changing the memory-mapped location of a block, blocks may be "shuffled" to provide what appears to be an instantaneous erase cycle to an external device. By replacing a dirty block with a pre-erased block, the erase time is hidden from devices external to memory device 200. In some embodiments, only one interface includes a block mapping circuit. In other embodiments both interfaces 240 and 260 include block mapping circuits, but utilize different block mapping algorithms.

Wear leveling circuit 269 is a circuit that spreads erase cycles among various blocks to reduce the effects of repeated erase cycles on a small number of blocks. In some embodiments, only one interface includes a wear leveling circuit. In other embodiments both interfaces 240 and 260 include wear leveling circuits, but utilize different wear leveling algorithms. In general, interfaces 240 and 260 may influence the operation of any circuit or algorithm differently. For example, interfaces 240 and 260 may influence the operation of any algorithm differently, including, but not limited to, error correction algorithms, wear leveling algorithms, programming algorithms, read algorithms, and erasing algorithms.

In some embodiments, one of interface 240 and 260 provides a single bit per memory cell in the corresponding logical partition in nonvolatile memory 204, and the other interface provides multiple bits per cell. In these embodiments and other embodiments, bit line drivers 202 and row decoders and wordline drivers 208 may drive bitlines and wordlines differently during write cycles based on whether interface 240 or interface 260 is performing the write.

In some embodiments, bitline drivers and wordline drivers may have the ability to drive various voltages or currents on bitlines and wordlines, and the various interfaces may influence the operation the bitline drivers and wordline drivers. For example, in some embodiments as described above, one logical partition may store one bit of data per floating gate memory cell, and another logical partition may store more than one bit of data per floating gate memory cell. In these embodiments, the bitline drivers and wordline drivers may drive different voltages based on the interface that is accessing the nonvolatile memory. In general, interfaces 240 and 260 may influence the generation of any signals in memory device 200, including but not limited to, program reference voltages, program reference currents, read reference voltages, and read reference currents.

Sense circuits 210 and 212 may also have different characteristics based on the operation of interfaces 240 and 260. For example, sense circuits 210 and 212 may utilize different reference values when comparing the state of the memory cells during a read. Various examples using different reference values are described below with reference to FIG. 3. Also for example, sense circuit 210 may perform multiple-level comparisons when the first logical partition stores multiple bits per cell, while sense circuit 212 may perform a single level comparison when the second logical partition stores one bit per cell.

Bus 270 and bus 272 provide an interconnect path between an external bus (not shown) and interfaces 240 and 260, respectively. In some embodiments, busses 270 and 272 are a common bus, and the communication bandwidth of the bus is shared between interface 240 and interface 260. In other embodiments, busses 270 and 272 are separate busses that support simultaneous operations within memory device 200. In some embodiments, interfaces 240 and 260 are logical interfaces. For example, one physical interface may exist that is logically divided into two functional units. In other embodiments interfaces 240 and 260 are two physically separate interfaces.

Figure 3:
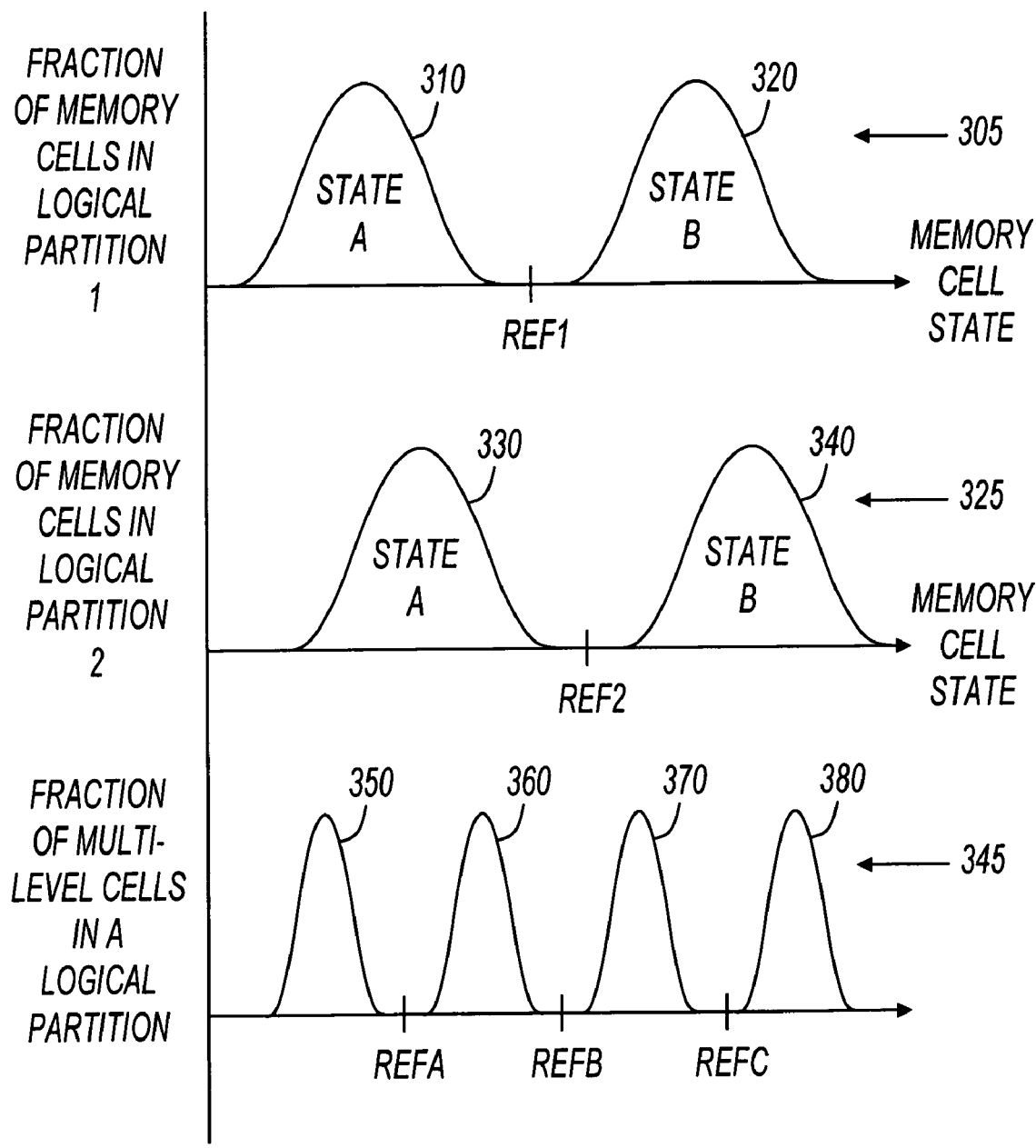
FIG. 3 shows possible memory cell state distributions for various logical partitions.

FIG. 3 shows possible memory cell state distributions for two logical partitions in a nonvolatile memory device. At 305, distributions 310 and 320 represent hypothetical memory cell state distributions of states for memory cells in a first logical partition of a nonvolatile memory, and at 325, distributions 330 and 340 represent hypothetical memory cell state distributions of states for memory cells in a second logical partition of a nonvolatile memory. For example, distribution 310 may represent a distribution of memory cells that hold a first state ("State A"), and distribution 320 may represent a distribution of memory cells that hold a second state ("State B"). The memory cell states (State A and State B) may be defined by any means depending on the type of nonvolatile memory device employed. For example, a memory state may be defined by a capacitance, a threshold voltage of a transistor, a current, a voltage, or any other discernable characteristic.

Generally, State A and State B are clearly defined when they are written into a memory device such as memory device 100 (FIG. 1) or memory device 200 (FIG. 2). There is a sufficient separation between those cells in State A and those cells in State B making it relatively easy to detect the difference between State A and State B to read the memory, regardless of the type of data stored in the memory cell. For example, when first written, program code, media files, and other types of data each have sufficient separations between State A and State B, and the states are relatively easily detected.

Over time, memory usage patterns for different types of data may disturb the states in different manners. For example, as described above, program code is written infrequently and read more frequently. Frequent reading without refresh may cause a particular type of disturbance on the state of the memory cells that are proximate to the cells being read. This disturbance is modeled in the hypothetical example of FIG. 3 by shifting distributions 310 and 320 to the left. Also for example, media files may be frequently rewritten and infrequently read. This may cause an entirely different set of disturbances on the states of the data stored in the memory. This disturbance is modeled in the hypothetical example of FIG. 3 by shifting distributions 330 and 340 to the right.

At 345, distributions 350, 360, 370, and 380 represent hypothetical distributions if states of multi-level cells in a logical partition. Four states are shown at 345 corresponding to two bits per cell, but this is not a limitation of the present invention. For example, an interface to a logical partition may support any number of bits per cell without departing from the scope of the present invention.

In some embodiments of the present invention, different reference values are used to compare with data when reading logical partitions in nonvolatile memory. For example, sensing circuits 210 (FIG. 2) may use REF1 as a reference to compare to values stored in memory cells that are part of the first logical partition, and sensing circuits 212 may use REF2 as a reference to compare to values stored in memory cells that are part of the second logical partition. In some embodiments, logical partitions are chosen to store program code and data separately. In these embodiments, reference levels for program code and data may be different as shown at 305 and 325 in FIG. 3. In some embodiments, the reference levels may be dynamically modified by interface circuits such as interface circuits 240 and 260 based on the expected usage patterns or historical usage patterns of the various logical partitions in the nonvolatile memory. Further, sensing circuits 210 (FIG. 2) may use multiple references such as REFA, REFB, and REFC as references to compare to values stored in multi-level cells. In some embodiments, sensing circuits compare stored values to multiple reference values simultaneously, and in some embodiments, sensing circuits compare stored values to multiple reference values serially.

Figure 4:
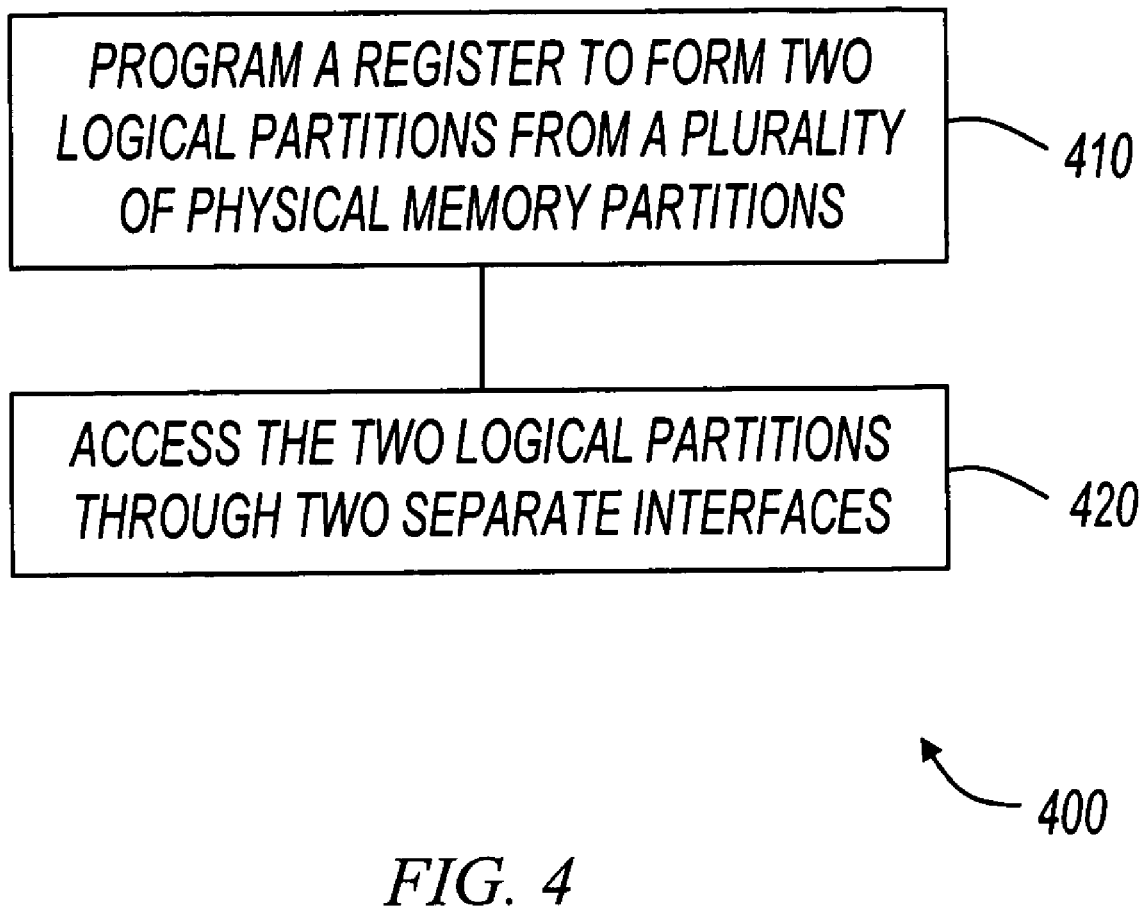
FIG. 4 shows a flowchart in accordance with various embodiments of the present invention.

FIG. 4 shows a flowchart in accordance with various embodiments of the present invention. In some embodiments, method 400 may be used to program a configuration register in a nonvolatile memory device. In some embodiments, method 400, or portions thereof, is performed by a processor or electronic system, embodiments of which are shown in the various figures. In other embodiments, method 400 is performed by a manufacturer of a memory device. Method 400 is not limited by the particular type of apparatus, software element, or person performing the method. The various actions in method 400 may be performed in the order presented, or may be performed in a different order. Further, in some embodiments, some actions listed in FIG. 4 are omitted from method 400.

Method 400 is shown beginning at block 410 in which a register is programmed to form two logical partitions from a plurality of physical memory partitions. In some embodiments, the register is held within a memory device that includes a memory core with multiple physical memory partitions. In some embodiments, the memory device also includes separate interface circuits to access the two logical partitions.

In some embodiments, the register is programmed through one of the separate interface circuits. For example, a manufacturer of the memory device may program the register using one of the separate interface circuits. In other embodiments, the register is programmed through a dedicated interface such as a serial interface or test interface. The particular type of interface used to program the register is not a limitation of the present invention.

In other embodiments, the register is programmed by an original equipment manufacturer (OEM) or a systems integrator. The register may be one-time programmable, in which case the OEM programs the register once to define logical partitions for the remainder of the life of the memory device. The register may be a read/write register, in which case the logical partitions may be redefined during the remainder of the life of the memory device.

At 420, the two logical partitions are accessed through the two separate interfaces. In some embodiments, the two separate interfaces have differences to support expected usage patterns of the two logical partitions. For example, in some embodiments, one logical partition may be used for program code and another logical partition may be used for data storage. In these embodiments, the two partitions may have different error correction schemes, read buffer sizes, write buffer sizes, and the like. Further, each of the separate interfaces may support a different number of bits per memory cell in the logical partition that it accesses.

Figure 5:
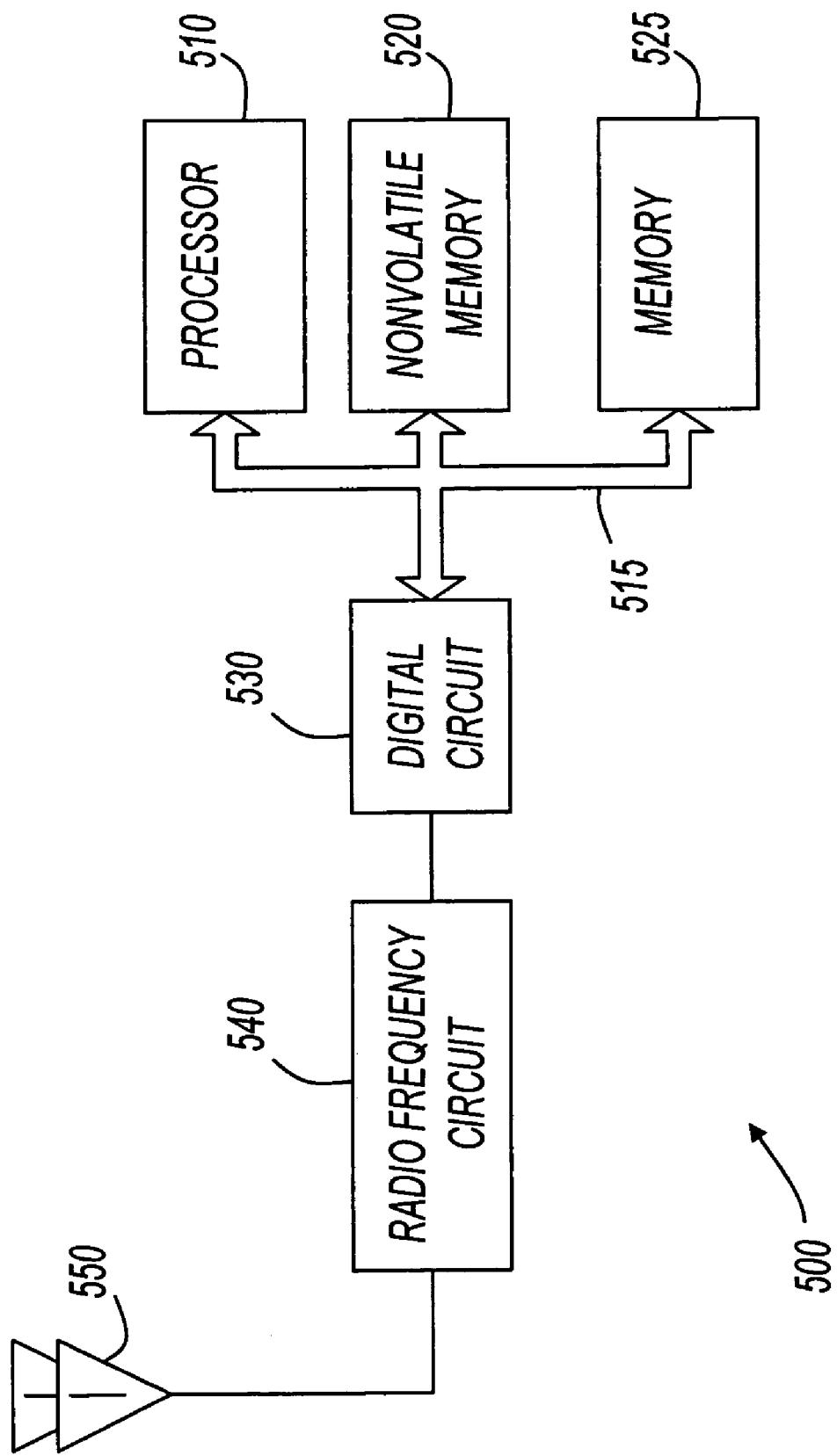
FIG. 5 shows a system diagram in accordance with various embodiments of the present invention.

FIG. 5 shows a system diagram in accordance with various embodiments of the present invention. Electronic system 500 includes processor 510, nonvolatile memory 520, memory 525, digital circuit 530, radio frequency (RF) circuit 540, and antennas 550. Processor 510 may be any type of processor adapted to access nonvolatile memory 520 and memory 525. For example, in some embodiments, processor 510 accesses program code from one logical partition within nonvolatile memory 520, and accesses data from another logical partition within nonvolatile memory 520. In some embodiments, processor 510 may be a microprocessor, a digital signal processor, a microcontroller, or the like.

Example systems represented by FIG. 5 include cellular phones, personal digital assistants, wireless local area network interfaces, or any other suitable system. Nonvolatile memory 520 may be adapted to hold information for system 500. For example, nonvolatile memory 520 may hold device configuration data, such as contact information with phone numbers, or settings for digital circuit 530 or RF circuit 540. Further, nonvolatile memory 520 may hold multimedia files such as photographs or music files. Still further, nonvolatile memory 520 may hold program code to be executed by processor 510. Nonvolatile memory 520 may be any of the nonvolatile memory embodiments described herein, including memory device 100 (FIG. 1) or memory device 200 (FIG. 2). Many other systems uses for nonvolatile memory 520 exist. For example, nonvolatile memory 520 may be used in a desktop computer, a network bridge or router, or any other system without an antenna.

Radio frequency circuit 540 communicates with antennas 550 and digital circuit 530. In some embodiments, RF circuit 540 includes a physical interface (PHY) corresponding to a communications protocol. For example, RF circuit 540 may include modulators, demodulators, mixers, frequency synthesizers, low noise amplifiers, power amplifiers, and the like. In some embodiments, RF circuit 540 may include a heterodyne receiver, and in other embodiments, RF circuit 540 may include a direct conversion receiver. In some embodiments, RF circuit 540 may include multiple receivers. For example, in embodiments with multiple antennas 550, each antenna may be coupled to a corresponding receiver. In operation, RF circuit 540 receives communications signals from antennas 550, and provides signals to digital circuit 530. Further, digital circuit 530 may provide signals to RF circuit 540, which operates on the signals and then transmits them to antennas 550.

Digital circuit 530 is coupled to communicate with processor 510 and RF circuit 540. In some embodiments, digital circuit 530 includes circuitry to perform error detection/correction, interleaving, coding/decoding, or the like. Also in some embodiments, digital circuit 530 may implement all or a portion of a media access control (MAC) layer of a communications protocol. In some embodiments, a MAC layer implementation may be distributed between processor 510 and digital circuit 530.

Radio frequency circuit 540 may be adapted to receive and demodulate signals of various formats and at various frequencies. For example, RF circuit 540 may be adapted to receive time domain multiple access (TDMA) signals, code domain multiple access (CDMA) signals, global system for mobile communications (GSM) signals, orthogonal frequency division multiplexing (OFDM) signals, multiple-input-multiple-output (MIMO) signals, spatial-division multiple access (SDMA) signals, or any other type of communications signals. The present invention is not limited in this regard.

Antennas 550 may include one or more antennas. For example, antennas 550 may include a single directional antenna or an omni-directional antenna. As used herein, the term omni-directional antenna refers to any antenna having a substantially uniform pattern in at least one plane. For example, in some embodiments, antennas 550 may include a single omni-directional antenna such as a dipole antenna, or a quarter wave antenna. Also for example, in some embodiments, antennas 550 may include a single directional antenna such as a parabolic dish antenna or a Yagi antenna. In still further embodiments, antennas 550 may include multiple physical antennas. For example, in some embodiments, multiple antennas are utilized to support multiple-input-multiple-output (MIMO) processing or spatial-division multiple access (SDMA) processing.

Memory 525 represents an article that includes a machine readable medium. For example, memory 525 represents a random access memory (RAM), dynamic random access memory (DRAM), static random access memory (SRAM), read only memory (ROM), flash memory, or any other type of article that includes a medium readable by processor 510. Memory 525 may store instructions for performing the execution of the various method embodiments of the present invention.

In operation, processor 510 reads instructions and data from either or both of nonvolatile memory 520 and memory 525 and performs actions in response thereto. For example, processor 510 may access instructions from nonvolatile memory 520 or memory 525 and program a configuration register in nonvolatile memory 520 to form two logical memory partitions within nonvolatile memory 520. In some embodiments, nonvolatile memory 520 and memory 525 are combined into a single memory device. For example, nonvolatile memory 520 and memory 525 may both be include in a single nonvolatile memory device.

Although the various elements of system 500 are shown separate in FIG. 5, embodiments exist that combine the circuitry of processor 510, nonvolatile memory 520, memory 525 and digital circuit 530 in a single integrated circuit. For example, memory 525 or nonvolatile memory 520 may be an internal memory within processor 510 or may be a microprogram control store within processor 510. In some embodiments, the various elements of system 500 may be separately packaged and mounted on a common circuit board. In other embodiments, the various elements are separate integrated circuit dice packaged together, such as in a multi-chip module, and in still further embodiments, various elements are on the same integrated circuit die.

The type of interconnection between processor 510 and nonvolatile memory 520 is not a limitation of the present invention. For example, bus 515 may be a serial interface, a test interface, a parallel interface, or any other type of interface capable of transferring command and status information between processor 510, nonvolatile memory 520, and memory 525.

In some embodiments, nonvolatile memory 520 may include NOR-type flash memory cells, and in other embodiments, nonvolatile memory 520 may include NAND-type flash memory cells. Memory cells in nonvolatile memory 520 may store one data bit per cell, or memory cells may be multilevel cells (MLC) capable of storing more than one bit per cell. Further, nonvolatile memory 520 may include multiple interfaces that allow a first logical partition to store one data bit per cell, and a second logical partition to store more than one bit per cell. Any nonvolatile memory arrangement may be utilized within nonvolatile memory 520 without departing from the scope of the present invention.

Although the present invention has been described in conjunction with certain embodiments, it is to be understood that modifications and variations may be resorted to without departing from the spirit and scope of the invention as those skilled in the art readily understand. Such modifications and variations are considered to be within the scope of the invention and the appended claims.

What is claimed is:

1. A memory device comprising:
   a nonvolatile memory divided into a plurality of physical partitions;
   a register coupled to logically group the plurality of physical partitions to form two logical partitions;
   a first interface to access a first of the two logical partitions; and
   a second interface to access a second of the two logical partitions;
   wherein the first interface includes a first read buffer having a first size, and the second interface includes a second read buffer having second size different than the first size.

2. A memory device comprising:
   a nonvolatile memory divided into a plurality of physical partitions;
   a register coupled to logically group the plurality of physical partitions to form two logical partitions;
   a first interface to access a first of the two logical partitions; and
   a second interface to access a second of the two logical partitions;
   wherein the first interface and the second interface employ different error correction schemes.

3. A memory device comprising:
   a nonvolatile memory divided into a plurality of physical partitions;
   a register coupled to logically group the plurality of physical partitions to form two logical partitions;
   a first interface to access a first of the two logical partitions; and
   a second interface to access a second of the two logical partitions;
   wherein the first interface and the second interface have different specifications.

4. The memory device of claim 3 wherein the first interface includes a hardware-only error correction device.

5. The memory device of claim 4 wherein the second interface employs error correction that includes hardware and software.

6. The memory device of claim 3 wherein only one of the two interfaces includes refresh circuitry.

7. The memory device of claim 3 wherein each of the plurality of physical partitions includes floating gate transistor memory cells.

8. The memory device of claim 3 wherein the register is mask programmable.

9. A memory device comprising;
   a nonvolatile memory divided into a plurality of physical partitions;
   a register coupled to logically group the plurality of physical partitions to form two logical partitions;
   a first interface to access a first of the two logical partitions; and
   a second interface to access a second of the two logical partitions;
   wherein the first interface influences operation of an item differently than the second interface, wherein the item is selected from a group consisting of voltage drivers, current drivers, wordline drivers, bitline drivers, and sense amplifiers.

10. A memory device comprising:
    a nonvolatile memory divided into a plurality of physical partitions;
    a register coupled to logically group the plurality of physical partitions to form two logical partitions;
    a first interface to access a first of the two logical partitions; and
    a second interface to access a second of the two logical partitions;
    wherein the first interface influences the generation of signals differently than the second interface, wherein the signal is selected from a group consisting of program reference voltages, program reference currents, read reference voltages, and read reference currents.

11. A memory device comprising:
    a nonvolatile memory divided into a plurality of physical partitions;
    a register coupled to logically group the plurality of physical partitions to form two logical partitions;
    a first interface to access a first of the two logical partitions; and
    a second interface to access a second of the two logical partitions;
    wherein the first interface influences the operation of an algorithm differently than the second interface, wherein the algorithm is selected from a group consisting of error correction algorithm, wear leveling algorithm, programming algorithm, read algorithm, and erasing algorithm.

12. A memory device comprising:
    a nonvolatile memory divided into a plurality of physical partitions; and
    a register coupled to logically group the plurality of physical partitions to form two logical partitions;
    wherein each of the plurality of physical partitions includes floating gate transistor memory cells, and wherein a number of bits stored per floating gate transistor memory cell is different for the two logical partitions.

13. A nonvolatile memory device comprising:
    multiple physical memory partitions that may be dynamically grouped to form two logical partitions; and
    two interfaces coupled to the two logical partitions, wherein the two interfaces are configured to have different operating characteristics, and wherein the two interfaces comprise two logical interfaces within one physical interface.

14. The nonvolatile memory device of claim 13 further comprising a register coupled to the two interfaces, wherein the register, when programmed, determines the dynamic grouping of the multiple physical memory partitions.

15. The nonvolatile memory device of claim 13 wherein each of the multiple physical memory partitions includes an array of floating gate memory cells.

16. A nonvolatile memory device comprising:
    multiple physical memory partitions that may be dynamically grouped to form two logical partitions; and two interfaces coupled to the two logical partitions, wherein the two interfaces are configured to have different operating characteristics, and wherein the two interfaces utilize different error correction algorithms.

17. The nonvolatile memory device of claim 16 wherein one of the two interfaces includes circuitry to provide a data refresh function.

18. A nonvolatile memory device comprising:
multiple physical memory partitions that may be dynamically grouped to form two logical partitions; and
two interfaces coupled to the two logical partitions, wherein the two interfaces are configured to have different operating characteristics, and wherein the two interfaces include different read buffer sizes.

19. A nonvolatile memory device comprising:
multiple physical memory partitions that may be dynamically grouped to form two logical partitions; and
two interfaces coupled to the two logical partitions, wherein the two interfaces are configured to have different operating characteristics, and wherein the two interfaces influence the values of references involved in the operation of sense amplifiers when reading.

20. An electronic system comprising:
multiple antennas;
radio frequency circuitry coupled to the multiple antennas;
a processor coupled to the radio frequency circuitry; and
a nonvolatile memory device coupled to the processor, the nonvolatile memory device including circuitry to allow dynamic partitioning of memory within the nonvolatile memory device and including at least two interfaces to access partitions within the nonvolatile memory
device wherein the at least two interfaces include circuitry to support memory access by the processor with different amounts of latency.

21. An electronic system comprising:
multiple antennas;
radio frequency circuitry coupled to the multiple antennas;
a processor coupled to the radio frequency circuitry; and
a nonvolatile memory device coupled to the processor, the nonvolatile memory device including circuitry to allow dynamic partitioning of memory within the nonvolatile memory device and including at least two interfaces to access partitions within the nonvolatile memory device, wherein the at least two interfaces include read buffers of different sizes and write buffers of different sizes.

* * * * *

UNITED STATES PATENT AND TRADEMARK OFFICE
CERTIFICATE OF CORRECTION

| | | |
|---|---|---|
| PATENT NO. | : 7,106,636 B2 | Page 1 of 1 |
| APPLICATION NO. | : 10/873907 | |
| DATED | : September 12, 2006 | |
| INVENTOR(S) | : Eilert et al. | |

It is certified that error appears in the above-identified patent and that said Letters Patent is hereby corrected as shown below:

Column 9, line 63, in Claim 9, after "comprising" delete ";" and insert -- : --, therefor.

Column 12, line 8, in Claim 20, after "device" insert -- , --.

Signed and Sealed this

Twenty-sixth Day of December, 2006

JON W. DUDAS
*Director of the United States Patent and Trademark Office*